(12) United States Patent
Coridan et al.

(10) Patent No.: US 10,793,965 B2
(45) Date of Patent: Oct. 6, 2020

(54) LIGHT-DIRECTED ELECTROCHEMICAL PATTERNING OF COPPER STRUCTURES

(71) Applicant: BOARD OF TRUSTEES OF THE UNIVERSITY OF ARKANSAS, Fayetteville, AR (US)

(72) Inventors: Robert H. Coridan, Fayetteville, AR (US); James M. Lowe, Fayetteville, AR (US)

(73) Assignee: Board Of Trustees Of The University Of Arkansas, Fayetteville, AR (US)

( * ) Notice: Subject to any disclaimer, the term of this patent is extended or adjusted under 35 U.S.C. 154(b) by 0 days.

(21) Appl. No.: 16/327,732

(22) PCT Filed: Aug. 29, 2017

(86) PCT No.: PCT/US2017/049187
§ 371 (c)(1),
(2) Date: Feb. 22, 2019

(87) PCT Pub. No.: WO2018/044930
PCT Pub. Date: Mar. 8, 2018

(65) Prior Publication Data
US 2019/0177867 A1     Jun. 13, 2019

Related U.S. Application Data

(60) Provisional application No. 62/380,911, filed on Aug. 29, 2016.

(51) Int. Cl.
*C25D 9/08*     (2006.01)
*H01L 31/0224*  (2006.01)
(Continued)

(52) U.S. Cl.
CPC .............. *C25D 9/08* (2013.01); *C25D 5/48* (2013.01); *C25D 7/12* (2013.01); *C25D 9/00* (2013.01);
(Continued)

(58) Field of Classification Search
CPC ................................... C25D 9/08; C25D 5/48
See application file for complete search history.

(56) References Cited

U.S. PATENT DOCUMENTS 4,507,181 A *  3/1985 Nath ..................... C25D 5/022
                                                    136/256
4,931,323 A    6/1990 Manitt et al.
(Continued)

FOREIGN PATENT DOCUMENTS

WO     2016/020759 A1    11/2016

OTHER PUBLICATIONS

United States International Searching Authority; International Search Report & Written Opinoin for PCT/US2017/049187; dated Dec. 22, 2017; 14 pages; Alexandria, VA.
(Continued)

*Primary Examiner* — Brian W Cohen
(74) *Attorney, Agent, or Firm* — Keith A. Vogt; Keith A. Vogt, Ltd

(57) ABSTRACT

A method creating a patterned film with cuprous oxide and light comprising the steps of electrodepositing copper from a solution onto a substrate; illuminating selected areas of said deposited copper with light having photon energies above the band gap energy of 2.0 eV to create selected illuminated sections and non-illuminated sections; and stripping non-illuminated sections leaving said illuminated sections on the substrate. An additional step may include galvanically replacing the copper with one or more noble metals.

17 Claims, 7 Drawing Sheets

(51) Int. Cl.

| | | |
|---|---|---|
| *C25D 9/00* | (2006.01) | |
| *C25D 5/48* | (2006.01) | |
| *C25D 7/12* | (2006.01) | |
| *H01L 21/288* | (2006.01) | |
| *H01L 21/321* | (2006.01) | |
| *H05K 3/02* | (2006.01) | |

(52) U.S. Cl.
CPC ........ *H01L 21/2885* (2013.01); *H01L 21/321* (2013.01); *H01L 31/0224* (2013.01); *H05K 3/027* (2013.01); *H01L 31/022425* (2013.01); *H05K 2203/0723* (2013.01)

(56) References Cited

U.S. PATENT DOCUMENTS

| | | | |
|---|---|---|---|
| 4,931,410 A | 6/1990 | Tokunaga et al. | |
| 5,595,637 A | 1/1997 | Tench et al. | |
| 6,258,702 B1 * | 7/2001 | Nakagawa | H01L 21/02425 |
| | | | 257/E21.078 |
| 6,905,950 B2 | 6/2005 | Subramanian et al. | |
| 8,394,465 B2 | 3/2013 | Lee et al. | |
| 8,795,502 B2 | 8/2014 | Cotte et al. | |
| 9,157,004 B2 | 10/2015 | Kang et al. | |
| 9,299,638 B2 | 3/2016 | Cabral, Jr. et al. | |
| 2004/0047688 A1 | 3/2004 | Akutsu et al. | |
| 2006/0057474 A1 | 3/2006 | Koike et al. | |
| 2009/0057154 A1 * | 3/2009 | Basker | C25D 5/02 |
| | | | 205/91 |
| 2011/0011745 A1 | 1/2011 | Ji et al. | |
| 2012/0175147 A1 | 7/2012 | Nakako et al. | |
| 2013/0309873 A1 | 11/2013 | Rizoc et al. | |
| 2015/0259816 A1 | 9/2015 | Minsek | |

OTHER PUBLICATIONS

Dejongh et al; Cu2O: Electrodeposition and Characterization; Chem. Mater. Dec. 20, 1999, 11, 3512-3517; American Chemical Society; U.S.

Golden et al.; Electrochemical Deposition of Copper(I) Oxide Films; Chem. Mater. 1996, 8, 2499-2504; American Chemical Society; US.

Paracchino et al; Highly active oxide photocathode for photoelectrochemical water reduction; Nature Materials; DOI: 10.10.38/NMAT3017; Jun. 2011; Nature.com; Macmillan Publishers Limited; U.S.

Wang et al; Electrodeposited copper oxide films: Effect of bath pH on grain orientation and orientation-dependent interfacial behavior; ScienceDirect.com; Oct. 18, 2006; Elsevier.

* cited by examiner

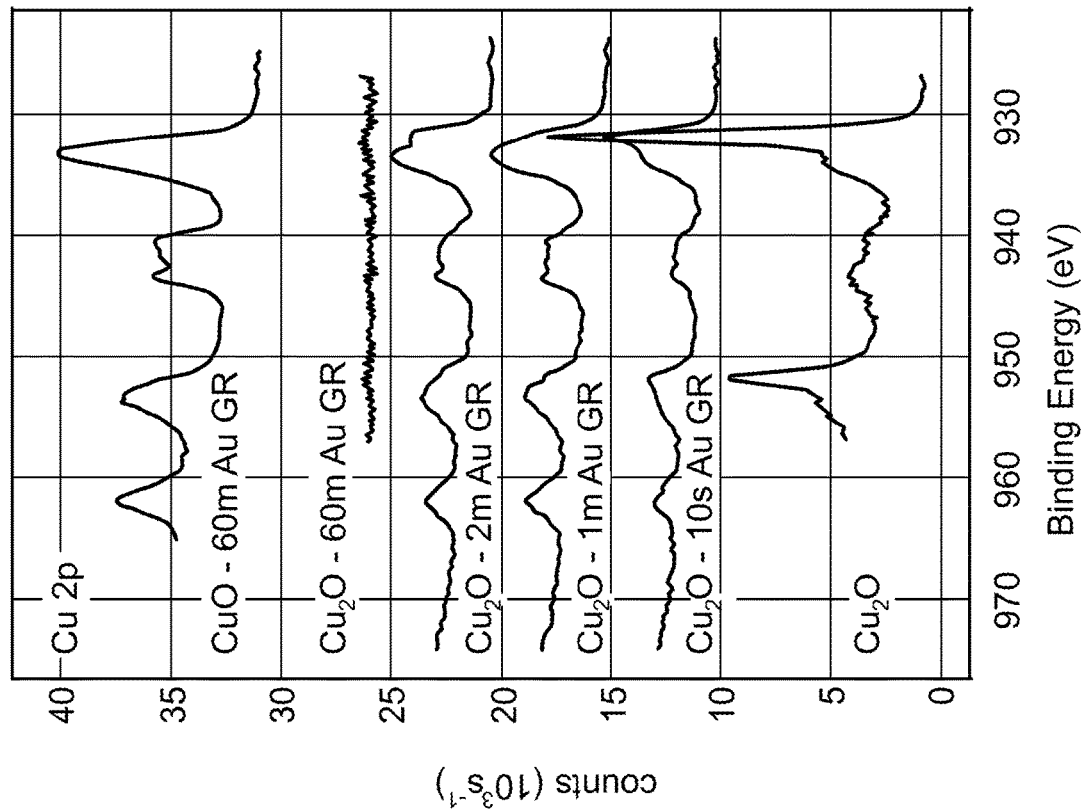
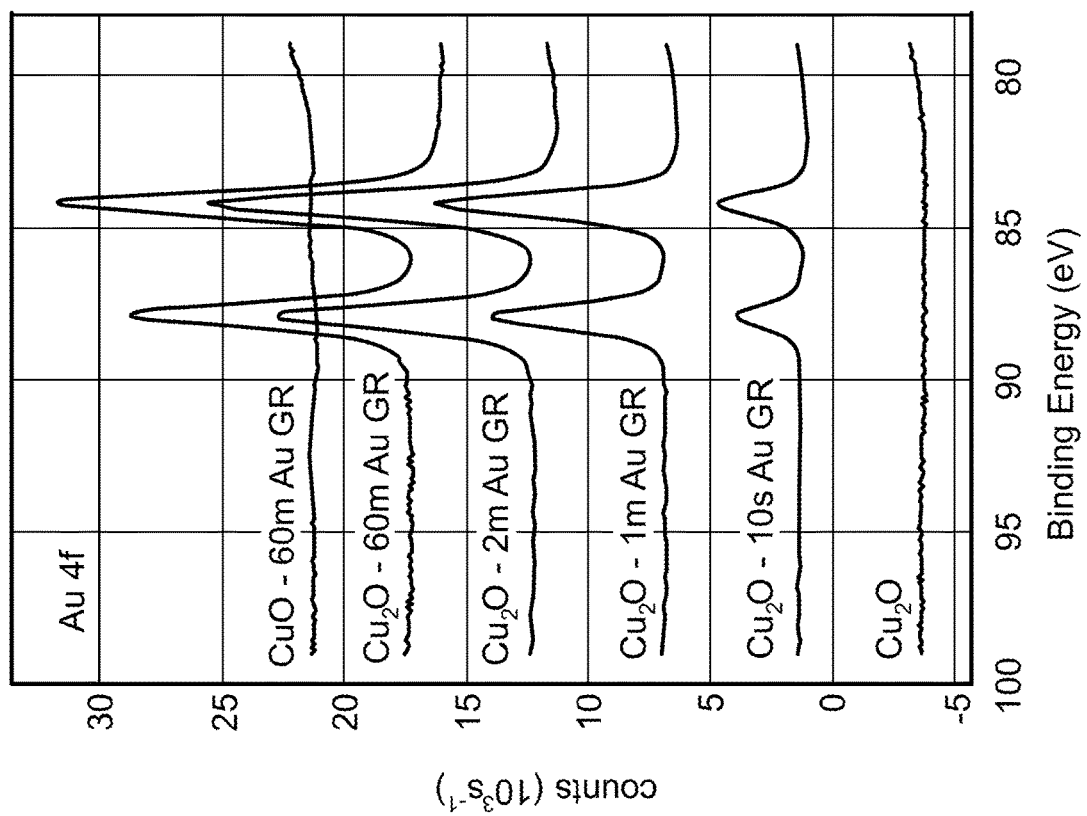
FIG. 4B
FIG. 4A

LIGHT-DIRECTED ELECTROCHEMICAL PATTERNING OF COPPER STRUCTURES

RELATED APPLICATIONS

This application claims the benefit of U.S. Provisional Application No. 62/380,911 filed Aug. 29, 2016, and herein incorporated by reference.

FIELD OF THE INVENTION

Cuprous oxide ($Cu_2O$) is considered to be an ideal semiconductor for solar or photoelectrochemical cells because it has a small (2.0 eV), direct band gap, is composed of inexpensive and earth abundant materials, and can be synthesized by electrodeposition or oxidation of Cu metal. Copper and its oxides are also an interesting material system because it can easily be oxidized, reduced, or dissolved electrochemically by choice of electrochemical potentials and pH of aqueous solution.

Copper is also an important material for developing and patterning circuits. A current practice to pattern copper in circuits utilizes expensive photolithography or direct-write methods like laser ablation.

BRIEF SUMMARY OF THE INVENTION

In one embodiment, the present invention provides an inexpensive method to pattern copper and oxide structures using direct lithographic processes driven by illumination. This eliminates the need for expensive lasers, photoresist chemistry, or chemical/physical vapor deposition facilities. It requires low power and illumination coherence constraints, making it an inexpensive alternative to current methods. Moreover, as copper is an increasingly expensive raw material, all of the copper not used in the patterning is available for other uses.

In another embodiment, the present invention provides patterning via direct illumination with no expensive photosensitive chemistry required.

In yet another embodiment, the present invention provides an inexpensive electrodeposition process, with no expensive evaporation processes required.

In yet another embodiment, the present invention provides an inexpensive electrodeposition process, with no expensive vacuum processes required.

In another embodiment, the present invention provides patterning processes which use incoherent light sources which reduce the need for high-power lasers to perform patterning.

In another embodiment, the present invention provides methods for patterning copper that may be generalizable to any conductive substrate (not just transparent ones).

In another embodiment, the present invention provides methods that use dark and transparent $Cu_2O$ which are chemically distinct phases to pattern thin films features including sub-millimeter features.

In yet another embodiment, the present invention provides methods that galvanically replaces deposited $Cu_2O$ pattern with one or more metals such as noble metals to create a pattern consisting of the substituted metal or metals. In a preferred embodiment, the metal is a noble metal.

In another embodiment, the present invention provides methods that direct write copper-based structures on electrodes to either pattern regions of $Cu_2O$ or to pattern conductive Cu patterns for circuits that replace photolithography in compatible materials systems, which is the current method by which copper is patterned.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

FIG. 4A shows a time series of Cu 2p and spectra for $Cu_2O$ films submerged in a Galvanic replacement reaction (GRR).

FIG. 4B shows a time series of Au 4f XPS spectra for $Cu_2O$ films submerged in 5 mM $NaAuCl4$ GRR solution for an embodiment present invention.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

Figure 1:
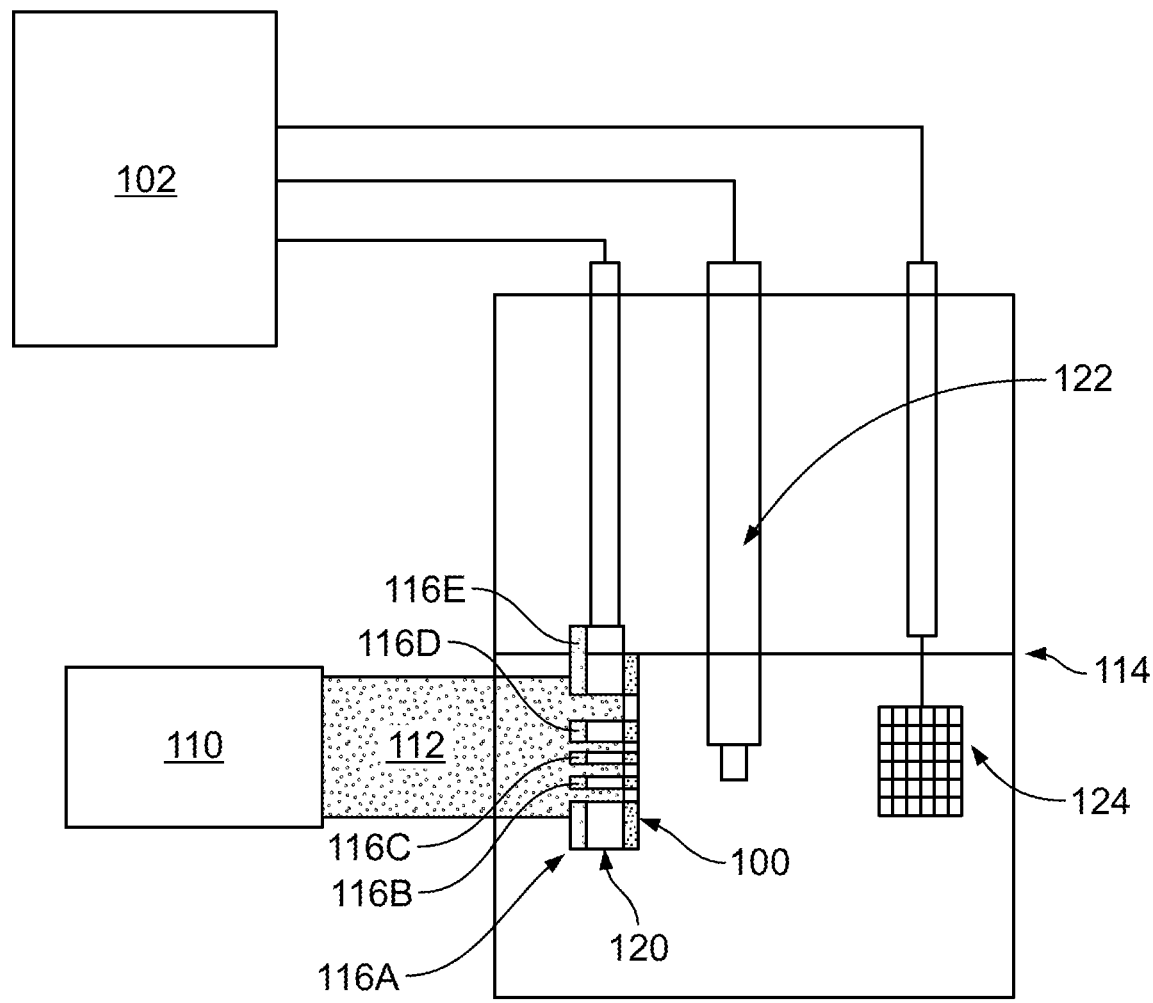
FIG. 1 is a schematic of a deposition procedure that may be used for an embodiment of the present invention.

As shown in FIG. 1, in one embodiment of the present invention, cuprous oxide ($Cu_2O$) 100 can be electrodeposited from a solution of copper sulfate by using a potentiostat 102, light source 110 which may be a light emitting diode that is used to create a light pattern 112, electrolyte solution 114, and mask 116A-116E which may be transparent. Also provided are electrode 120, which may be transparent or non-transparent, reference electrode (RE) 122, and counter electrode (CE) 124.

In a preferred embodiment, cuprous oxide ($Cu_2O$) can be electrodeposited from a solution of copper sulfate and lactic acid, adjusted to basic pH (9-13) with sodium hydroxide. The electrodeposition is carried out on a conductive substrate like fluorine-doped tin oxide on glass, metal-coated substrates like evaporated gold on glass, or a silicon wafer as well as other substrates to which the metal will adhere.

As shown, a cathodic potential is applied to the electrode in solution (roughly −0.4V vs. Ag/AgCl reference electrode) to reduce the copper ions in solution and form the solid $Cu_2O$ phase as a thin-film coating on the surface of the electrode. Cuprous oxide is synthesized as its hole-doped, p-type photoactive phase in this process. Moreover, it is a photocathode, meaning that the minority carrier electrons that are transferred at the interface to drive the electrodeposition can also be excited by light absorption to drift to the interface.

It has been found that the electrons are energetic enough to reduce $Cu_2O$ on the surface to Cu as a method of photodoping. As a result, the regions of the thin film grown under illumination are visibly and chemically different than the regions grown without illumination as shown in FIGS. 2A-2C.

Figure 2A:
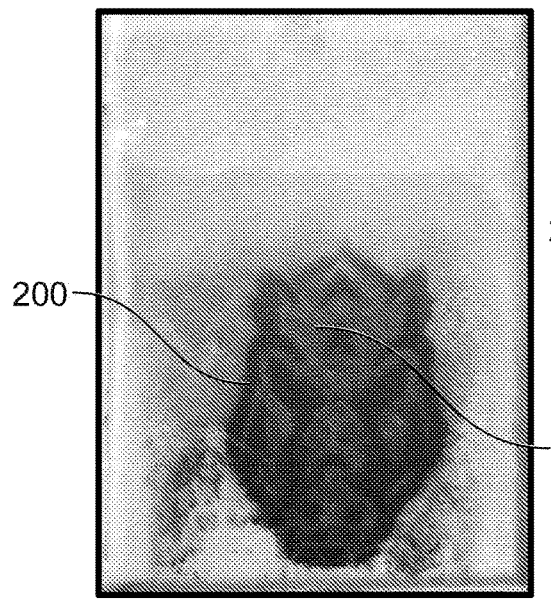
FIG. 2A provides an example of direct illuminated writing of black cuprous oxide (illuminated area) and plain, yellow cuprous oxide (masked area) via potentiostatic electrodeposition for an embodiment of the present invention.
Figure 2B:
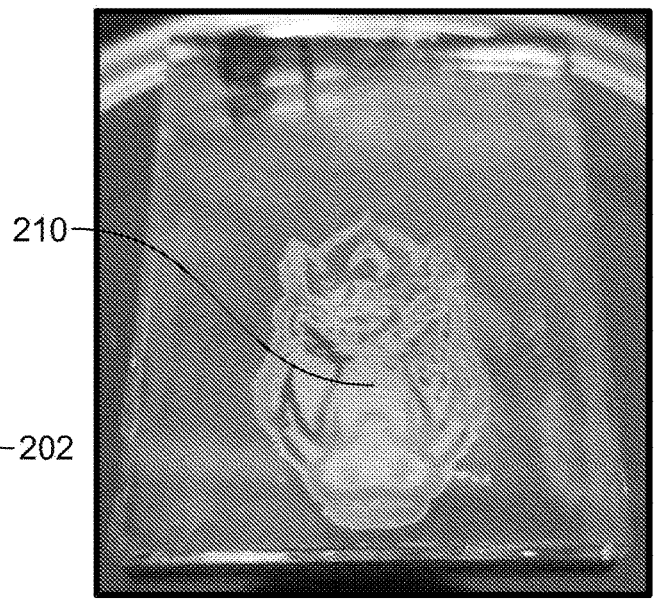
FIG. 2B illustrates a reflection image of direct illuminated writing of cuprous oxide (illuminated area) with cathodic electrodeposition/anodic dissolution for an embodiment of the present invention.

FIG. 2A provides an example of direct illuminated writing of black cuprous oxide (illuminated area) 200 and plain, yellow cuprous oxide (masked area) 202 via potentiostatic electrodeposition for an embodiment of the present invention. FIG. 2B illustrates a reflection image of direct illuminated writing of cuprous oxide (illuminated area) 210 with cathodic electrodeposition/anodic dissolution for an embodiment of the present invention.

Figure 2C:
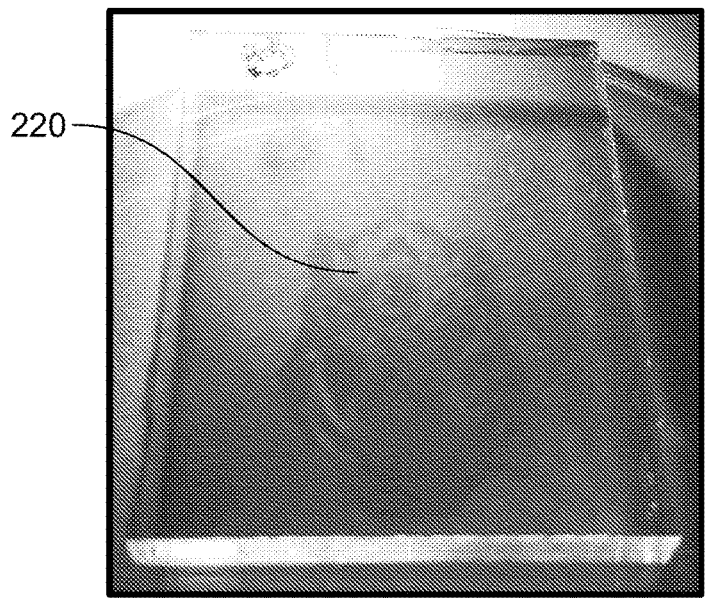
FIG. 2C illustrates a back-illuminated image of direct illuminated writing of cuprous oxide (illuminated area) with cathodic electrodeposition/anodic dissolution for an embodiment of the present invention.

FIG. 2C illustrates a back-illuminated image of direct illuminated writing of cuprous oxide (illuminated area) 220 with cathodic electrodeposition/anodic dissolution for an embodiment of the present invention. As a result, the methods provided by the present invention provide methods to grow copper structures patterned by illumination.

The electrode can be switched between the cathodic (depositing) potential and a slightly anodic (dissolving) potential. The illumination of the pattern may occur during, before or in-between switching. Due to the photodoping of grown films, the areas under illumination or that have been illuminated, during this potential step procedure remain while the areas not under illumination or not subject to illumination are stripped away by dissolution.

Patterning the light via a transparency mask allows for the patterning of regions of photodoped $Cu_2O$, and therefore the two-dimensional structure of the thin film on the electrode surface. In one embodiment, the conductive interface may be a transparent fluorine-doped tin oxide on glass electrode.

A number of different methods may be used to create the patterns. In the embodiment shown in FIG. 1, pattern 100 is formed on a first surface of substrate 120 while mask 116 is located on an oppposingly located second surface. For this embodiment, light source 110 and mask 116 are used to create patterns of light that are transmitted through transparent substrate 120. This creates the illumination patterns that alter the $Cu_2O$. In other words, the backside of the substrate is illuminated for this embodiment. Patterns may then be created as described above.

Figure 3A:
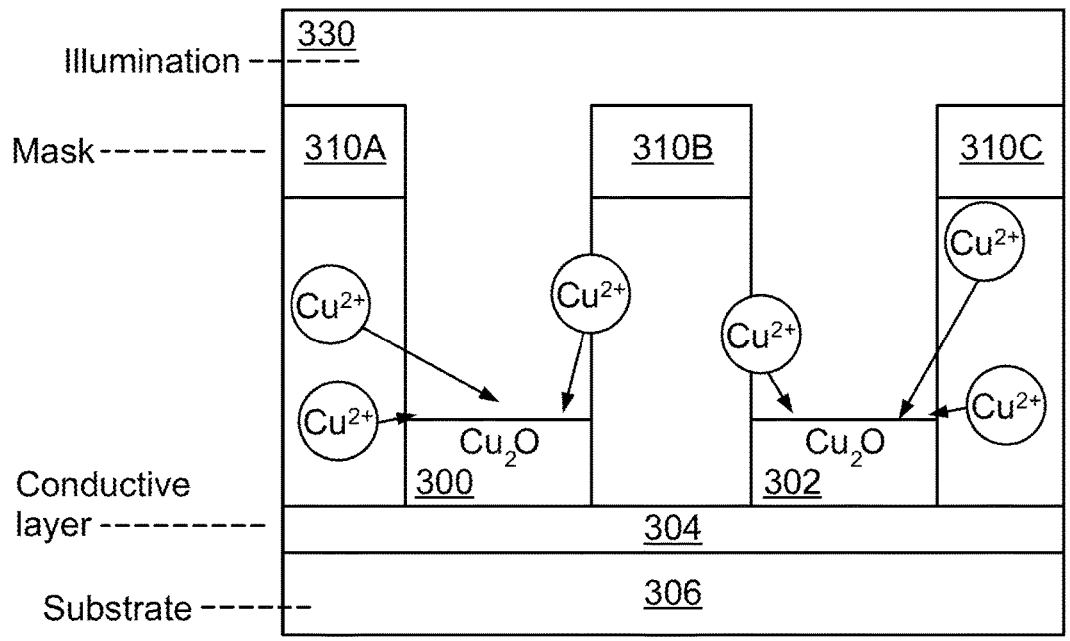
FIG. 3A is a schematic of the photolithographic patterning of $Cu_2O$ on a conductive surface for an embodiment present invention.

As shown in FIG. 3A, pattern 300 may be created from illuminating the front side of the substrate 306. For this embodiment, patterning from the front allows for the use of non-transparent substrates and also allows for the patterning to occur on the growing interface 304. To promote the growth of the $Cu_2O$ pattern, mask 310 needs to be located a spaced distance away from growing surface 304 so as to not block the solution from reaching surface 304. Patterns may then be created as described above.

In yet another embodiment of the present invention, a projector may be used to create the illumination patterns from either the front side or backside. This would eliminate the need to use mask 116 or 301. Patterns may then be created as described above. In other embodiments, the projection source can be used to produce a time-dependent, two-dimensional illumination pattern (like an image) that changes while the film is grown to add three-dimensional structure to the film. Under constant cathodic electrodeposition potential, changing the illumination patterns, by time, intensity, color of the illumination, or any combination of these three illumination parameters as a dynamical illumination image creates a three-dimensional, photodoped "black" $Cu_2O$ structure into the thin film. Under the cathodic electrodeposition/anodic dissolution work cycle, this can result into a printed three-dimensional structure of $Cu_2O$ on the electrode surface. In either case, portions of the deposited film can be removed by chemical dissolution or through electrochemical stripping during growth to produce a thin film patterned in three dimensions. This method could be used to grow three-dimensional templates (like stamps or molds), structured electrocatalysts, three-dimensional circuits, metamaterials (nanostructured materials with non-intuitive optical properties, like negative refractive index or generation of strange polarizations), or nanotextured, low-friction tribological surfaces.

Figure 3B:
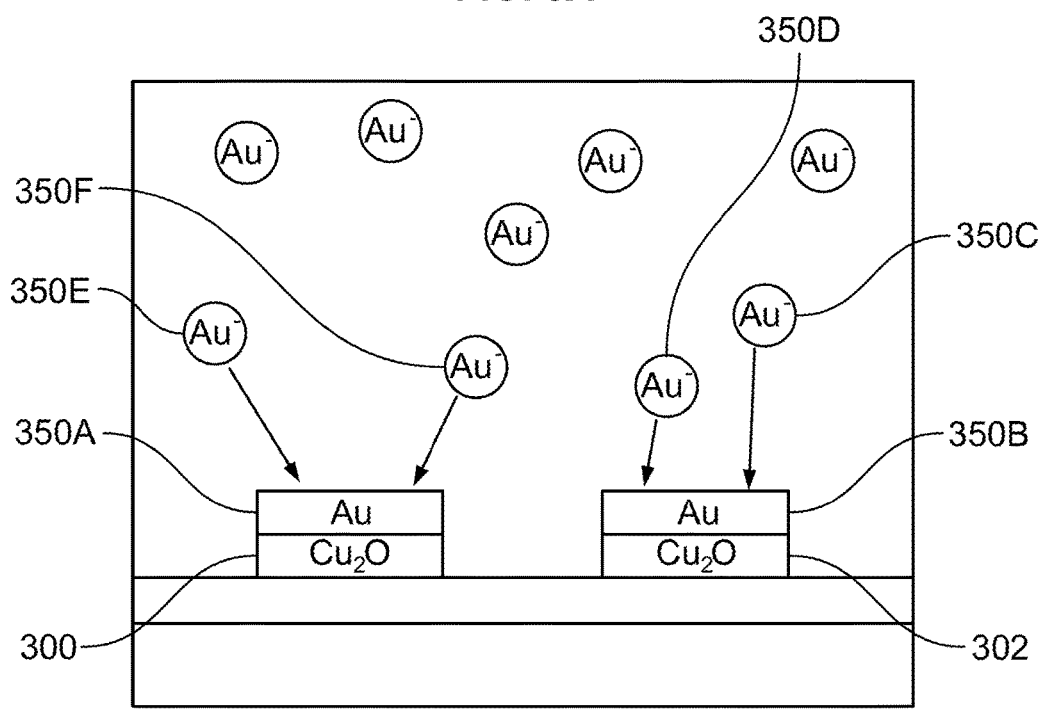
FIG. 3B depicts the galvanic replacement of $Cu_2O$ with Au, Ag, or other noble metals that spontaneously form on the surface while oxidizing the $Cu_2O$ back to soluble $Cu2+$ ions for an embodiment present invention.

FIGS. 3A and 3B also show a two-step scheme for the solution-phase light-directed patterning of noble metal surfaces based on the photolithographic properties of $Cu_2O$ for another embodiment of the present invention. As shown in FIG. 3A, photolithographic patterning of $Cu_2O$ 300 and 302 on a conductive surface 304 and substrate 306 may be accomplished as described above through the use of a mask and illumination source.

The patterned film may be fabricated, in a preferred embodiment, with an electrochemical duty cycle of cathodic $Cu_2O$ deposition followed by anodic dissolution. The remaining $Cu_2O$ is the portion of the film that was exposed to light during growth. The steps of depositing, illuminating and dissolution may be repeated.

The second step of the embodiment is shown in FIG. 3B. As shown, this step utilizes the galvanic replacement of $Cu_2O$ 300 and 302 with Au, Ag, or other noble metals 350A-350F that spontaneously form on the surface while oxidizing the $Cu_2O$ back to soluble Cu2+ ions.

The present invention may be used to fabricate integrated circuits, print interconnections between electrical components, perform three-dimensional patterning of circuits, provide direct write lithography masks, pattern semiconductor structures for photovoltaics or photoelectrochemical cells, electrocatalyst patterning, controlling the composition of multi-metal electrocatalysts, photodoping $Cu_2O$ to form electrodeposited PN junctions for electrical diodes and photovoltaics, microelectrode patterning for dry cell batteries (via low temp oxidation to CuO).

In still other embodiments, the present invention provides a method to pattern the local doping/chemistry of thin films of cuprous oxide with light. By illuminating cuprous oxide with photon energies above the band gap energy of 2.0 eV, the illuminated area of the cuprous oxide thin film is increasingly darkened with increasing intensity during electrodeposition. By stepwise scanning of the electrode potential, the area of the thin film not under illumination can be stripped from the electrode, leaving the remaining illuminated areas on the electrode or conductive surface. This process allows for directly writing copper-based structures on electrodes to either pattern regions of $Cu_2O$ semiconductor or to pattern conductive Cu patterns for circuits. The Cu patterns may then be replaced with one or more noble metals as described above.

In one application of the present invention, $Cu_2O$ films were submerged in 5 mM NaAuCl4 GRR solution (pH 2.7) for 0 s, 10 s, 1 min, 2 min, and 60 min. The Cu 2p spectra show that the starting $Cu_2O$ surface quickly oxidizes to CuO. Eventually all of the $CuO/Cu_2O$ dissolves as indicated by the lack of the Cu XPS features after 60 min. A $Cu_2O$ film that was air-annealed (400 C for 1 hour) to CuO still showed the CuO XPS features after 60 minutes in the Au solution. The Au 4f spectra show that Au begins to deposit within the first 10 s of exposure and increases intensity. The CuO film shows no Au deposition after 60 minutes.

Figure 5A:
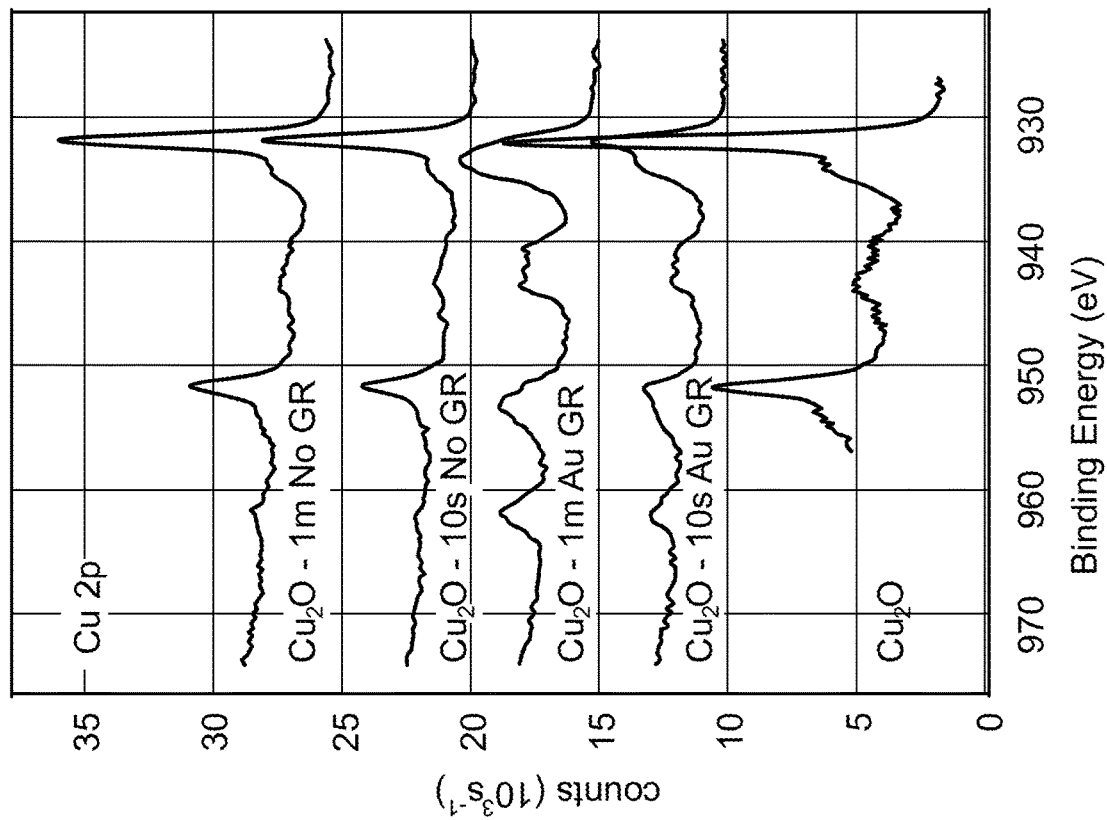
FIG. 5A is a comparison of Cu 2p spectra for $Cu_2O$ films submerged in an aqueous buffer for an embodiment present invention.
Figure 5B:
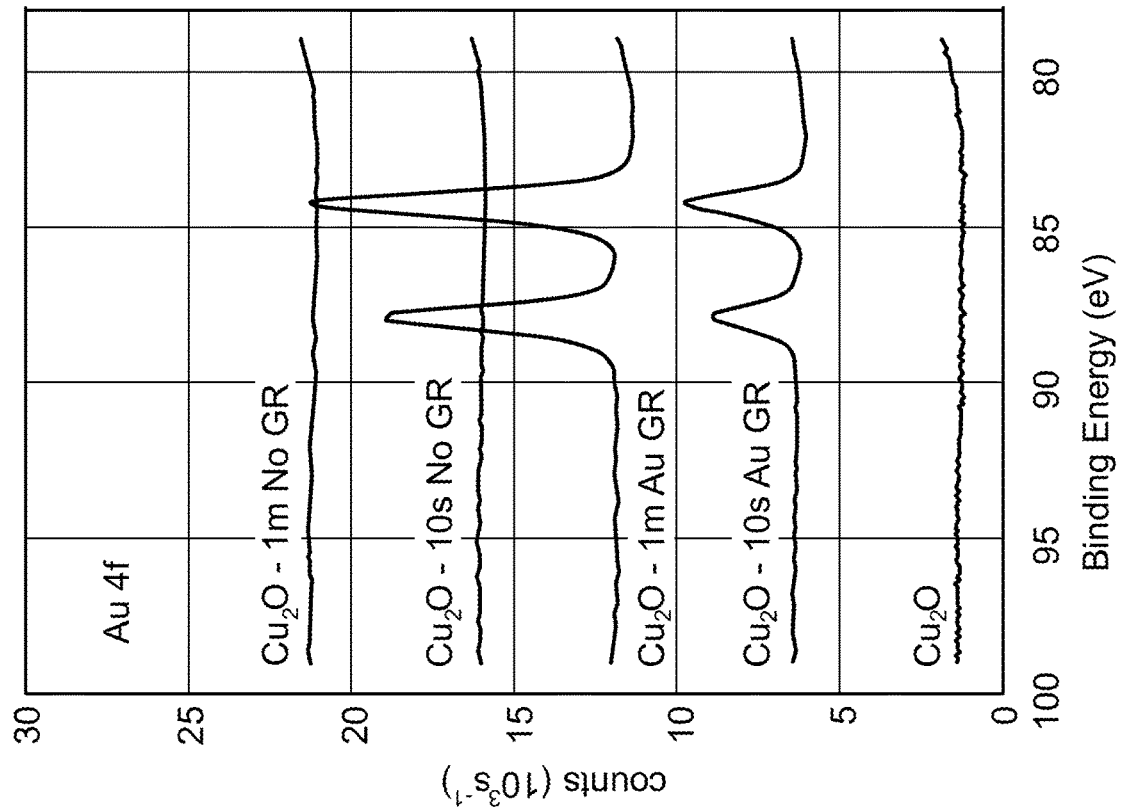
FIG. 5B is a comparison of Au 4f XPS spectra for $Cu_2O$ films submerged in an aqueous buffer for an embodiment present invention.

FIGS. 5A and 5B are comparisons of Cu 2p and Au 4f XPS spectra for $Cu_2O$ films submerged in an aqueous buffer (pH 2.7) with 10 s, 1 min and without NaAuCl4. Plain, unexposed $Cu_2O$ is shown for reference. The Cu 2p spectra show that without NaAuCl4 in the solution, the $Cu_2O$ surface maintains its oxidation state through dissolution. The solid-state oxidation to CuO only occurs in the presence of AuCl4(−) reduction.

Figure 6A:
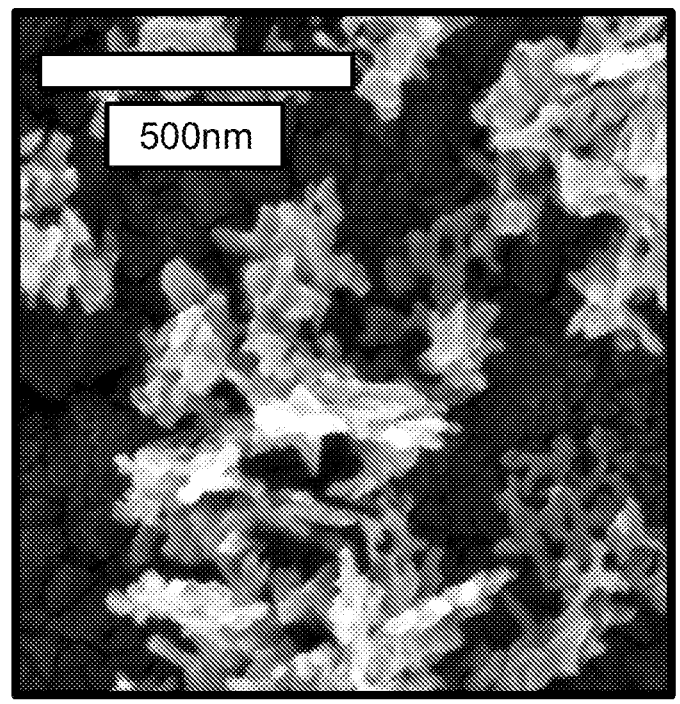
FIG. 6A is a SEM micrograph of the nanoscale of GRR-deposited Au on $Cu_2O$ after 5-minute exposure for an embodiment present invention.
Figure 6B:
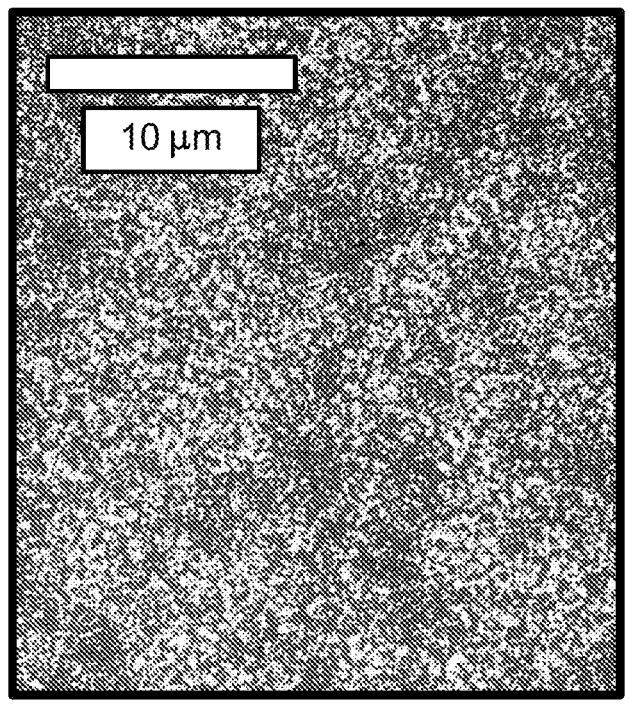
FIG. 6B is a SEM micrograph of the nanoscale microstructure of GRR-deposited Au on $Cu_2O$ after 5-minute exposure for an embodiment present invention.

FIGS. 6A and 6B are SEM micrographs of the nanoscale morphology and microstructure of GRR-deposited Au on $Cu_2O$ after a 5-minute exposure.

Figure 7A:
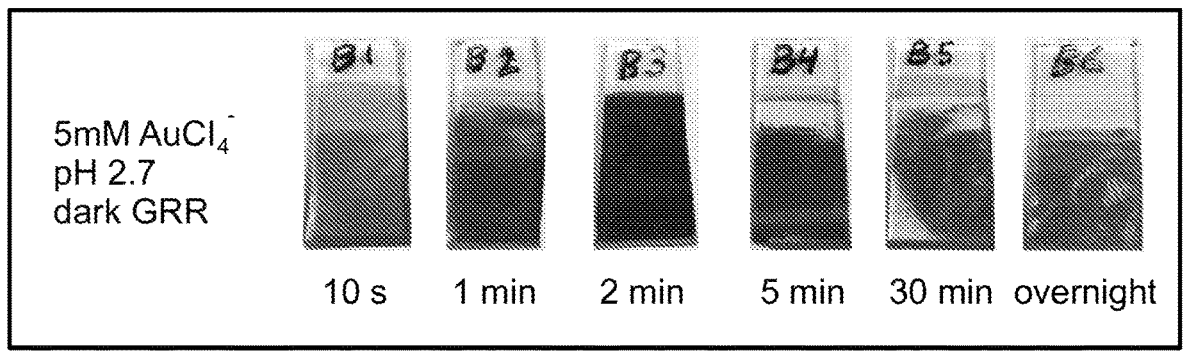
FIG. 7A illustrates GRR-deposited Au on $Cu_2O$ without illumination as shown in FIG. 4A.
Figure 7B:
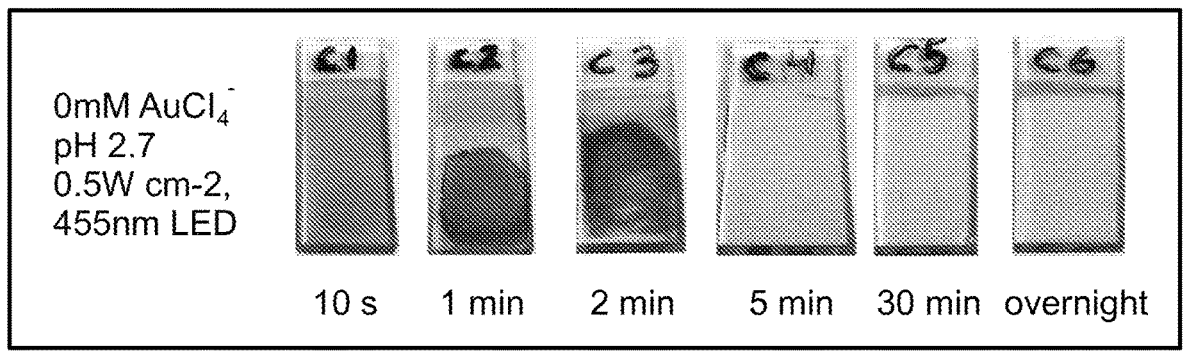
FIG. 7B illustrates GRR-deposited Au on $Cu_2O$ with 455 nm LED illumination but without $NaAuCl4$ in the solution for an embodiment present invention.
Figure 7C:
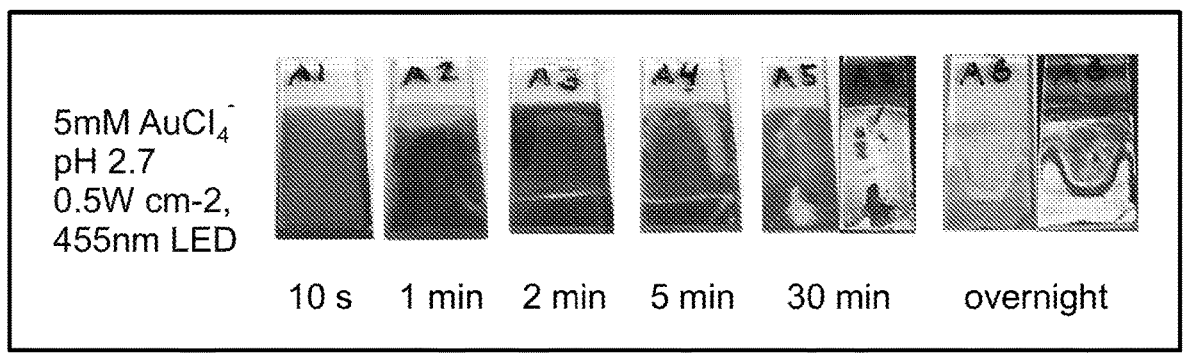
FIG. 7C illustrates GRR-deposited Au on $Cu_2O$ and with 455 nm LED illumination and with $NaAuCl4$ in the solution for an embodiment present invention.

FIG. 7A illustrates GRR-deposited Au on $Cu_2O$ without illumination as shown in FIG. 4A. FIG. 7B illustrates GRR-deposited Au on $Cu_2O$ with 455 nm LED illumination but without NaAuCl4 in the solution. FIG. 7C illustrates GRR-deposited Au on $Cu_2O$ and with 455 nm LED illumination and with NaAuCl4 in the solution.

In yet other embodiments, the present invention provides methods for creating patterns by electrodeposition that are not limited to $Cu_2O$, but include other materials that may be deposited by electrodeposition. In a preferred method, a film of photoactive material having an electrodeposition polarity that matches its photoactive polarity is deposited in two ways. First by electrodeposited and by the application of light. The light acts as an additional bias which results in additional deposition of material. Thus, in areas of the illumination, the deposition rate of material is greater that in the non-illuminated areas, creating a pattern of areas with more deposited material as compared to the non-illuminated areas.

In circumstances where the desired pattern is to include areas of deposited material and areas where there is no deposited material, the illumination may be continued during the reversal of the polarity. Reversing the polarity causes dissolution of the deposited material. Non-illuminated areas have a higher rate of dissolution than the illuminated areas since the illumination reverses or retards the magnitude of the reverse polarity. Thus, non-illuminated areas are stripped of deposited material at a higher rate and will have all material removed prior to the removal of all material from the illuminated areas.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiments, methods, and examples, but by all embodiments and methods within the scope and spirit of the disclosure.

What is claimed is:

1. A method of creating a patterned film with cuprous oxide ($Cu_2O$) and light comprising the steps of:
    (a) electrodepositing cuprous oxide from a solution comprising copper ions onto a substrate;
    (b) illuminating selected areas of said deposited cuprous oxide with light having photon energies above the band gap energy of 2.0 eV to create selected illuminated sections and non-illuminated sections; and
    (c) stripping cuprous oxide from said non-illuminated sections leaving said deposited cuprous oxide on said illuminated sections of the substrate.

2. The method of claim 1 wherein the substrate is a transparent, conductive substrate.

3. The method of claim 1 wherein the substrate is a non-transparent, conductive substrate.

4. The method of claim 1 wherein the pattern is made from $Cu_2O$ having chemically distinct phases.

5. The method of claim 1 wherein the pattern is a film having features including sub-millimeter features.

6. The method of claim 1 wherein $Cu_2O$ is galvanically replaced with a noble metal and said $Cu_2O$ is reduced back to soluble Cu ions.

7. The method of claim 6 wherein said noble metal is Au.

8. The method of claim 6 wherein said noble metal is Ag.

9. The method of claim 1 wherein stripping occurs after illumination.

10. The method of claim 1 wherein stripping occurs during illumination.

11. The method of claim 1 wherein stripping occurs in-between illumination.

12. The method of claim 1 wherein a projector is used to illuminate selected areas of said deposited cuprous oxide.

13. The method of claim 1 wherein a light source and a mask located a spaced distance from said deposited cuprous oxide are used to illuminate selected areas of said deposited cuprous oxide.

14. The method of claim 13 wherein the surface of the substrate on which the cuprous oxide is deposited is illuminated.

15. The method of claim 1 wherein a light source and a mask located on a transparent substrate are used to illuminate selected areas of said deposited cuprous oxide.

16. The method of claim 15 wherein an opposing located surface of the substrate on which the cuprous oxide is deposited is illuminated.

17. The method of claim 1 wherein steps (a)-(c) are repeated.

* * * * *